United States Patent [19]

Kim

[11] Patent Number: 5,324,970

[45] Date of Patent: Jun. 28, 1994

[54] INTERCONNECTION STRUCTURE IN SEMICONDUCTOR DEVICE

[75] Inventor: Myong-jae Kim, Pusan, Rep. of Korea

[73] Assignee: Samsung Electronics Co., Ltd., Kyunggi-do, Rep. of Korea

[21] Appl. No.: 874,002

[22] Filed: Apr. 27, 1992

[30] Foreign Application Priority Data

Nov. 6, 1991 [KR] Rep. of Korea .................. 91-9571

[51] Int. Cl.$^5$ ...................... H01L 23/54; H01L 29/92
[52] U.S. Cl. .................................. 257/306; 257/623; 257/752
[58] Field of Search ............... 257/623, 624, 773, 752, 257/306, 307, 308

[56] References Cited

U.S. PATENT DOCUMENTS

| | | | |
|---|---|---|---|
| 4,512,074 | 4/1985 | Sasaki | 257/623 |
| 4,884,121 | 11/1989 | Ishii | 257/752 |
| 4,994,893 | 2/1991 | Ozaki et al. | 257/306 |
| 5,057,896 | 10/1991 | Gotou | 257/623 |

Primary Examiner—Robert Limanek
Attorney, Agent, or Firm—Cushman, Darby & Cushman

[57] ABSTRACT

An interconnection structure in a semiconductor device for connecting a lower conductive layer to an upper conductive layer comprises a projection which is left by selectively etching a semiconductor substrate to a certain depth, a lower conductive layer formed inwardly from at least part of the surface of the projection, a surrounding structure formed around the projection, and an upper conductive layer formed on the upper surfaces of the surrounding structure and connected to at least part of the surface of the lower conductive layer. The planarization of the upper conductive layer is improved, preventing contact failure.

18 Claims, 5 Drawing Sheets

INTERCONNECTION STRUCTURE IN SEMICONDUCTOR DEVICE

BACKGROUND OF THE INVENTION

The present invention relates to a semiconductor device, particularly to the interconnection structure of a semiconductor device realizing a reliable contact.

Electronic equipments of higher function, speed, and capacity require increased integration and more miniaturation of semiconductor devices. Particularly in DRAM devices, this is accomplished by reducing the surface area occupied by a unit cell. However, the reduction of the area occupied by the unit cell also diminishes cell capacitance, making it difficult to secure a sufficient charge in order to store the equivalent information of a less integrated device. To solve this problem of diminishing cell capacitance due to the reduction of the area occupied by the unit cell, various methods have been proposed for three-dimensional structures, which do increase cell capacitance, but on the other hand, aggravate the step between one element and the next, posing several other problems to solve.

A DRAM device includes a capacitor having a storage electrode, a dielectric film and a plate electrode, and a transistor having a source region, a drain region and a gate electrode (word line), all of which make up a unit cell. The DRAM requires a bit line to form a reliable contact with the drain region in order to transmit and store information. The bit line is formed after the formation of the transistor and capacitor, so as to overcome the difference of the step between the substrate where impurity diffusion regions such as source and drain regions are formed, and the capacitor's upper surface. Nevertheless, as a semiconductor memory device becomes more integrated, the requirement of storage capacitance per unit area increases. Thus, the height of the capacitor inevitably increases, accordingly, the step increases, and contrary to the goal, the end result is that the reliability of the bit line contacts decrease proportionally to the worsening of the step.

FIG. 1 is a cross section of the conventional interconnection structure of a semiconductor device. The above-described reliability decrease will be explained in more detail.

Referring to FIG. 1, two transistors share a common drain region 16, and each has a source region 14 and a gate electrode 18 on the active region of the semiconductor device substrate 10 which are divided into active and nonactive regions by a field oxide layer 12. Two capacitors C1 and C2 are formed in contact with the source region 14 of the transistors, and each includes a storage electrode 30, a dielectric layer 32 and a plate electrode 34. The above pair of transistors and capacitors constitute a pair of DRAM cell. An insulating layer 40 is formed for electrically isolating the cells, and a bit line 50 is formed to be in contact with drain region 16 by piercing the insulating layer 40. The bit line 50 is in contact with the drain region 16 via contact hole 9 which is as deep as the combined thickness of the capacitors C1 and C2 and the insulating layer 40.

If conductive material is deposited and patterned to form conductive layer on a semiconductor substrate with deep grooves, the conductive layer on the side walls and edges of the grooves is formed thinly or remains unformed altogether, which causes contact failures, stress migration, and/or electromigration, and deteriorates the reliability of the metallization. The contact failures and poor metallization reliability increase in proportion to the aspect ratio (height/width) of the contact hole.

Miniaturation of the memory cells is accomplished by reducing the impurity diffusion region (drain region 16) with which bit line 50 makes contact, and increasing cell capacitance by heightening the capacitors lengthens the depth of the contact hole 9 formed in insulating layer 40. A taller contact hole leads to a greater aspect ratio, thereby deteriorating the reliability of bit line contacts.

SUMMARY OF THE INVENTION

Therefore, it is an object of the present invention to provide an interconnection structure of a semiconductor device which overcomes the contact failure of a bit line and the poor reliability thereof.

It is another object of the present invention to provide an interconnection of a semiconductor device which can form a planar conductive layer.

To attain the objects, there is provided a interconnection structure in a semiconductor device, for connecting a lower conductive layer to an upper conductive layer, which comprises:
   a projection which is left to a certain height by selectively etching a semiconductor substrate;
   a lower conductive layer formed inwardly from at least part of the surface of the projection;
   a surrounding structure formed around the projection; and
   an upper conductive layer formed on the upper surfaces of the surrounding structure and connected to at least part of the surface of the lower conductive layer,
   whereby the flatness of said upper conductive layer is improved.

To attain the objects, there is provided according to another aspect of the present invention, an interconnection structure in a semiconductor device for connecting a lower conductive layer to an upper conductive layer, which comprises:
   a projection which is left to a certain height by selectively etching a semiconductor substrate;
   a lower conductive layer formed outwardly from at least part of the surface of the projection;
   a surrounding structure formed around said projection; and
   an upper conductive layer formed on the upper surface of said surrounding structure, and connected to at least part of the surface of said lower conductive layer,
   whereby the flatness of said upper conductive layer is improved.

Further, to attain the objects, there is provided according to further another aspect of the present invention, in a semiconductor device including switching transistors each having a source and a drain region formed around the surface of a substrate and isolated from each other by a channel region, and a gate electrode formed by interleaving a gate oxide layer on the channel region of the substrate; capacitors each having a storage electrode in contact with the source region of the switching transistor and formed on a certain area, a dielectric layer covering the storage electrode, and a plate electrode formed on the dielectric layer; and a bit line in contact with the drain region of the switching transistor, an interconnection structure for connecting the bit line and the drain region comprises a projection formed by etching all the surrounding areas to a predetermined depth except at least part of regions of the substrate where said drain region will be formed; the switching transistors and the capacitors formed on the etched region of the substrate to constitute a surrounding structure; the drain region formed inwardly from the surface of the projection and serving as an element of the switching transistor; and the bit line formed on the upper surfaces of the surrounding structure and the projection to be in contact with the projection.

BRIEF DESCRIPTION OF THE DRAWINGS

The above objects and other advantages of the present invention will become more apparent by describing in detail a preferred embodiment of the present invention with reference to the attached drawings in which.

DETAILED DESCRIPTION OF THE INVENTION

Figure 2:
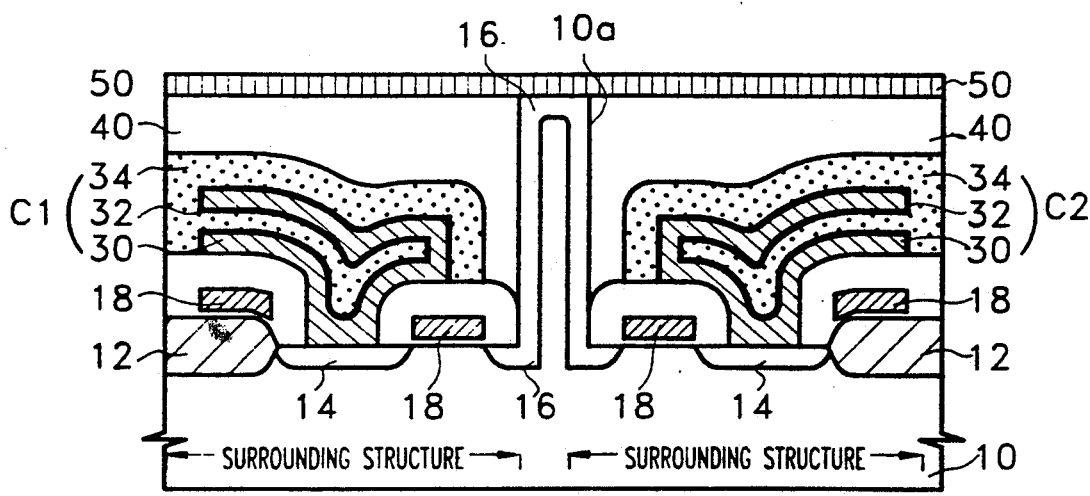
FIG. 2 is a cross section of an interconnection structure of a semiconductor device of the present invention.

Referring to FIG. 2, in an interconnection structure of a semiconductor device having DRAM cell arrays, a bit line 50 is in contact with, a projection 10a in which impurity diffusion region, i.e., drain region 16 is formed, and surrounding structures are formed around the projection (those are: field oxide layer 12, gate electrodes 18, storage electrodes 30, dielectric layer 32 and plate electrodes 34), the surrounding structure being electrically isolated from the projection by an insulating layer 40. Planarization is achieved when a conductive layer for example, bit line 50 in contact with the projection, is formed on the insulating layer.

Figure 1:
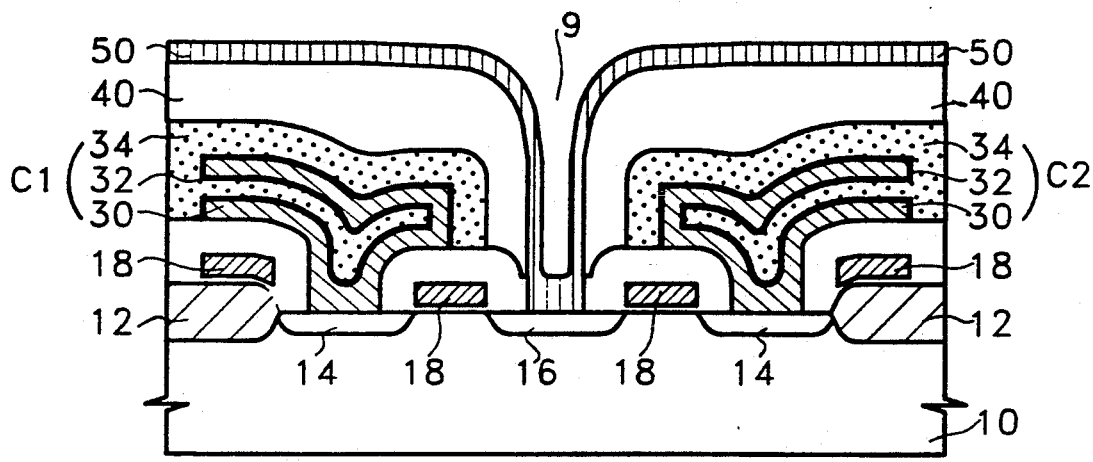
FIG. 1 is a cross section of a conventional interconnection structure of a semiconductor device.

The semiconductor device shown in FIG. 2 realizes a device comprising a bit line which is more planar, more reliable and has much fewer contact failures than the conventional device shown in FIG. 1, where contact hole 9 shown in FIG. 1 is formed in insulating layer 40 to make contact between the bit line and the impurity diffusion region.

Figure 3A:
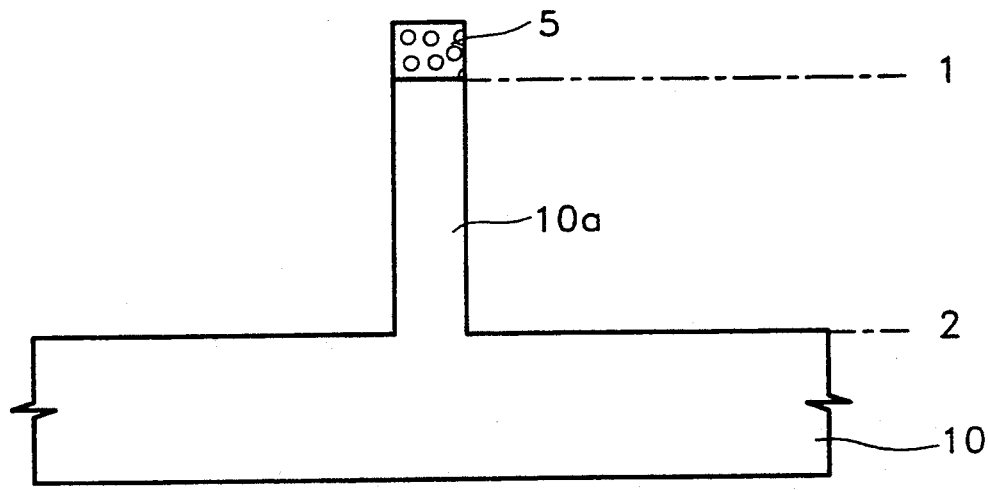
FIGS. 3A through 3C are cross sections showing an embodiment of the forming process of the interconnection structure of the semiconductor device according to the present invention.
Figure 3B:
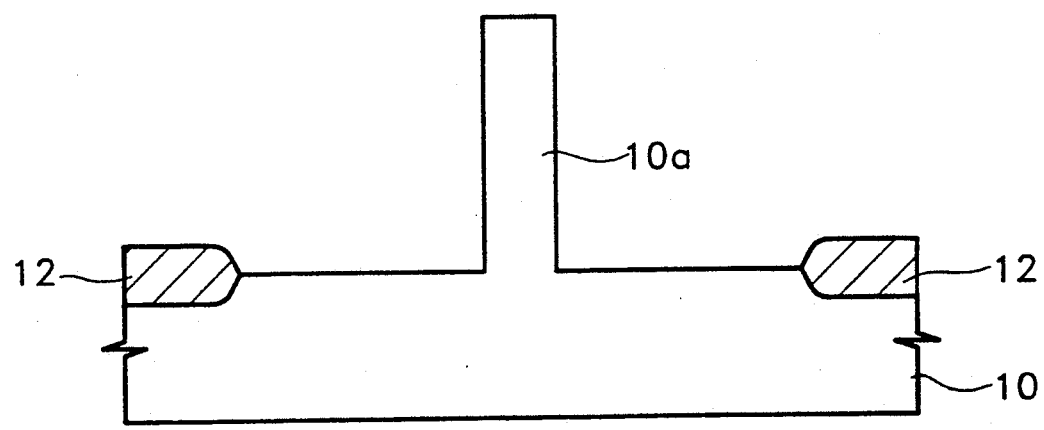
Figure 3C:
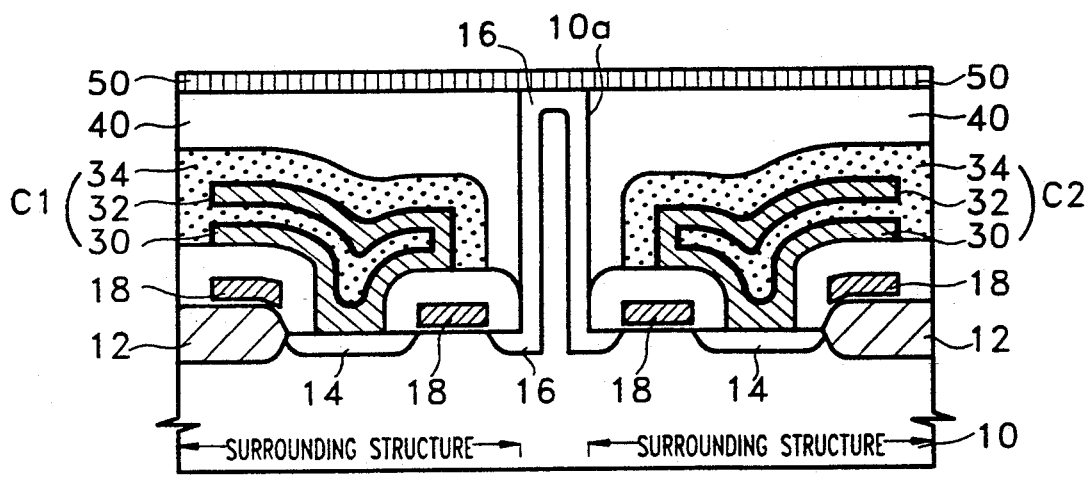

FIGS. 3A and 3C are cross sections of an embodiment of the forming method of the interconnection structure of the semiconductor device according to the present invention.

Referring to FIG. 3A which illustrates a process for forming projection 10a on a substrate 10, after a photosensitive layer is coated on substrate 10, a photosensitive layer pattern 5 is created by removing the photosensitive material from all the surrounding areas except a region where an impurity diffusion region will be in contact with a bit line, that is, where a drain region is to be formed. Projection 10a is formed by etching the substrate to a certain depth, using the photosensitive layer pattern 5 as an etching mask. At this time, the height of the projection 10a can be adjusted in accordance with that of surrounding structures; to be either higher or lower than the surrounding structures. The height of projection 10a in FIG. 3A is calculated to be height 1 (the level of the original surface of the substrate) minus height 2 (the level of the etched substrate).

Figure 4:
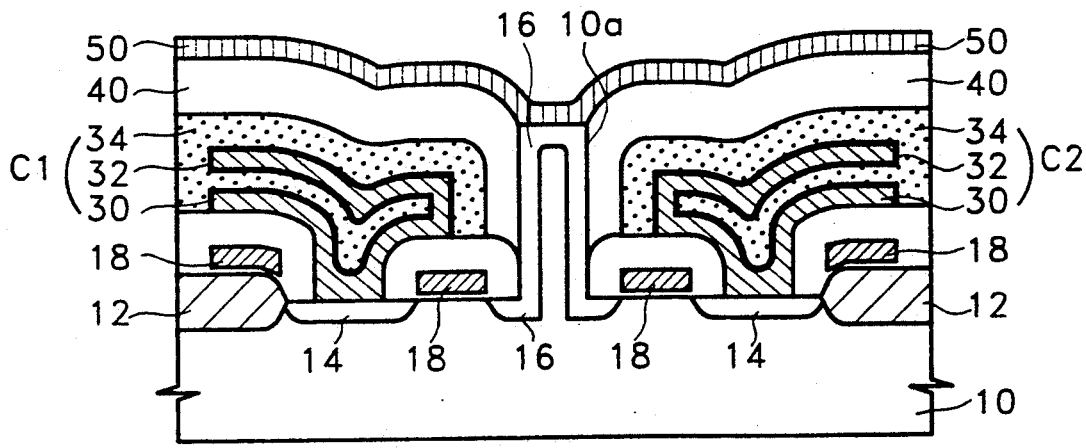
FIG. 4 is a cross section of an interconnection structure manufactured by another embodiment of the forming process of the interconnection structure of the semiconductor device according to the present invention.

When, as shown in FIG. 3C, the height of projection 10a is established to be higher than the surrounding structure, e.g., a transistor and a capacitor, the surrounding structure is difficult to form. However, since the surface 40 of FIG. 2 where a bit line is formed is planarized, advantages are gained in preventing a stringer which may be produced when patterning a conductive material on the surface with grooves, and also preventing void and disconnection produced when connecting a bit line via a deep hole, thereby obtaining reliable semiconductor devices. On the other hand, when, as shown in FIG. 4, the height of projection 10a is lower than the surrounding structures, the resultant surface is not planar. But, this produces the advantage where surrounding structures can be formed easily since the difference of steps is far smaller than the conventional one of FIG. 1 to reduce the problems caused by the difference of steps and the substrate was not etched so deeply in forming the projection.

Meanwhile, the side walls of the projection 10a may be formed in various shapes, that is, vertically as in the above embodiment, or, as shown in FIGS. 5A to 5C and 6, part of a surrounding structure may be located on the sloping surface of the projection as a way of minimizing the area which a unit cell occupies.

Referring to FIG. 3B which illustrates a process of forming field oxide layer 12, first, defects (not shown) present on the etched surface of the substrate after the formation of projection 10a, are removed by a heat treatment. The defects were produced by the etching performed in FIG. 3A, and worsen the operational characteristics of the device. Then, to divide the substrate into active and inactive regions, field oxide layer 12 is formed by conventional methods, for example, LOCOS, BOX and the like.

FIG. 3C illustrates a process of forming surrounding structures, then having bit line 50 make contact with projection 10a. Referring to FIG. 3C, first, gate oxide layer and polysilicon layer are stacked throughout the entire surface of substrate 10 in which field oxide layer 12 is formed. Then, gate electrodes 18 are formed by patterning the stacked gate oxide layer and polysilicon layer, using a gate electrode mask. Source regions 14 and drain region 16 are formed to become self-aligned with the gate electrode, which is the same method as the formation of a conventional transistor. After an inter-insulating layer for electrically insulating gate electrodes 18 is formed, contact holes are formed so that storage electrodes 30 will make contact with the source regions, and then, capacitors C1 and C2 are formed by a conventional method. Subsequently, an insulating layer 40 is thickly coated on the entire resultant structure in order to insulate the drain region 16 formed on projection 10a from the capacitors. In this embodiment, since the projection is higher than the surrounding structures, the surface of the insulating layer 40 may be evenly formed. For planarization, the insulating material is thickly coated and then etched back until only the top surface of the projection is exposed. After that, a conductive layer is deposited and patterned using a mask for bit line formation, defining a bit line 50 in contact with the drain region 16 via projection 10a. In so doing, the bit lines are formed evenly and have minimum resistance since the surface of the insulating layer 40 is planar.

According to the aforementioned embodiment, instead of the formation of a contact hole, a projection having the inverse shape of the contact hole is formed on the region where the contact hole having large aspect ratio (narrow and deep) should be formed, so that a bit line's contact, and therefore the reliability of the device, is improved. Moreover, since the bit line is planar, the resistance of the conductive layer decreases to improve the cell's electrical properties and also, subsequent processes can be carried out on a planar surface.

FIG. 4 is a cross section of another embodiment of the forming method of the interconnection structure of the semiconductor device according to the present invention. In accordance with this embodiment, by lowering the height of projection 10a to be less than that of the surrounding structures, the cells are easier to make.

Figure 5A:
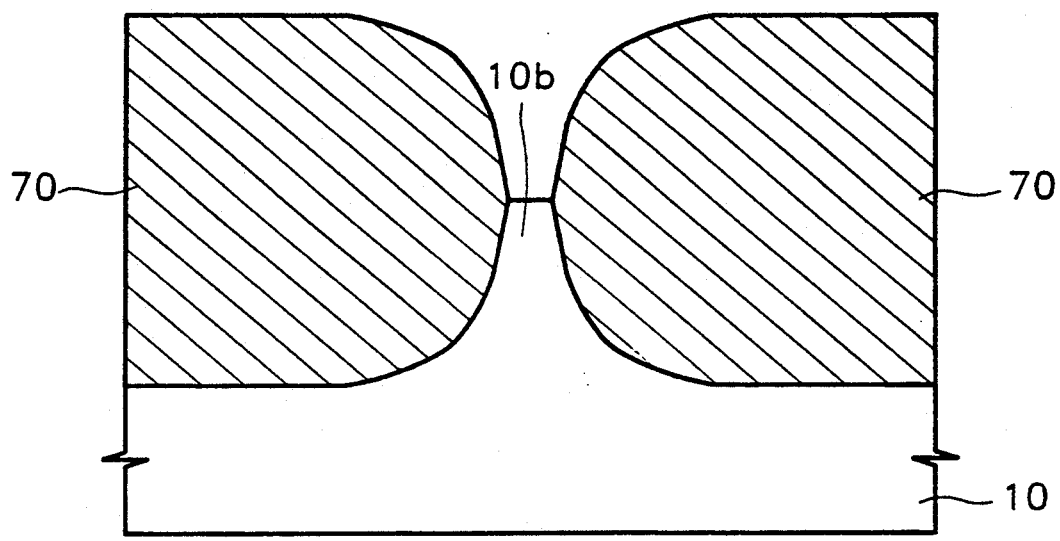
FIGS. 5A through 5C are cross sections showing further another embodiment of the forming method of the interconnection structure of the semiconductor device according to the present invention.
Figure 5B:
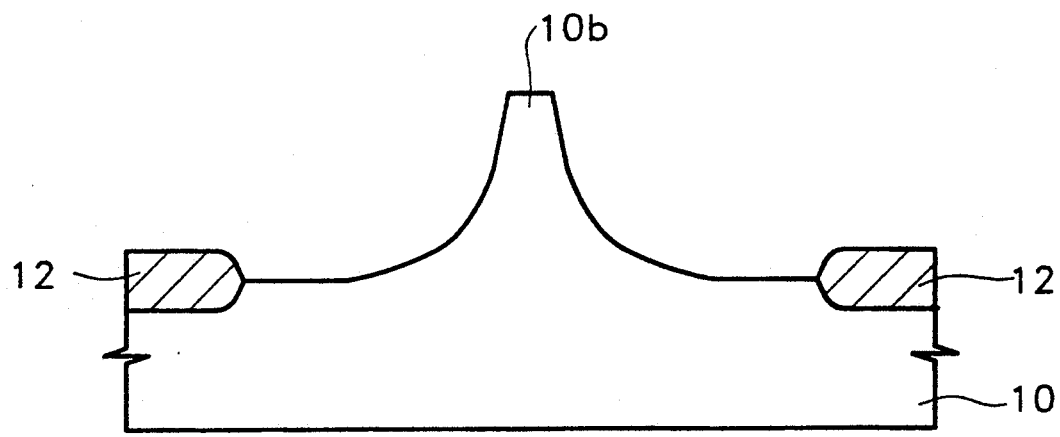
Figure 5C:
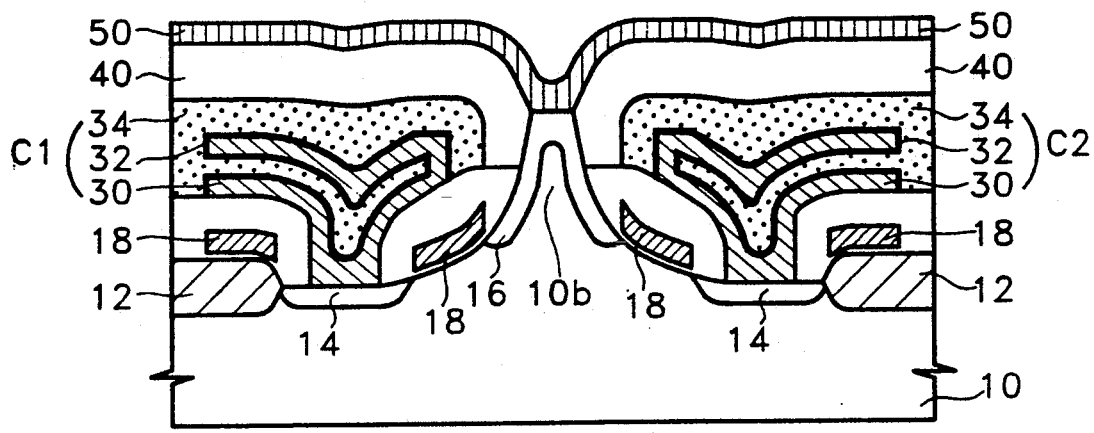

FIGS. 5A, 5B and 5C are cross sections of yet another embodiment of the forming method of the interconnection structure of the semiconductor device according to the present invention, which provide the method of forming projection 10b having the beforementioned inclined and rounded side walls, using the formation of a thick field oxide layer.

As shown in FIG. 5A, after a field oxide layer 70 is thickly formed on the whole area except where the bit line will make contact, a projection 10b having inclined and rounded side walls is formed by removing the thick field oxide layer with an oxide etchant. Then, a heat treatment is applied to eliminate the defects produced during the removal of the field oxide. At this time, since the field oxide layer 70 is made of $SiO_2$ produced by combining oxygen supplied to the substrate with the silicon of the substrate (e.g. LOCOS method), the field oxide layer infiltrate the substrate. The penetration rate is usually about 45% of the total thickness of the finished field oxide layer. The resultant height of projection 10b depends upon the thickness of the field oxide layer which is determined by first calculating the height of the surrounding structures. It is obvious to a person having ordinary skill in the art that the height of the projection will be 45% of the thickness of the finished field oxide layer. Subsequently, another field oxide layer 12 as shown in FIG. 5B, is to define active and inactive regions, then surrounding structures are formed around projection 10b. Finally, bit line 50 is formed in contact with the projection as shown in FIG. 5C.

In this embodiment, the side walls of the projection are concave, so the lower parts thereof may be used for the surrounding structures. Hence, the area of a unit cell is reduced and the manufacturing process simplified, because no additional mask is used, compared with the process of FIGS. 3A through 3C.

Figure 6:
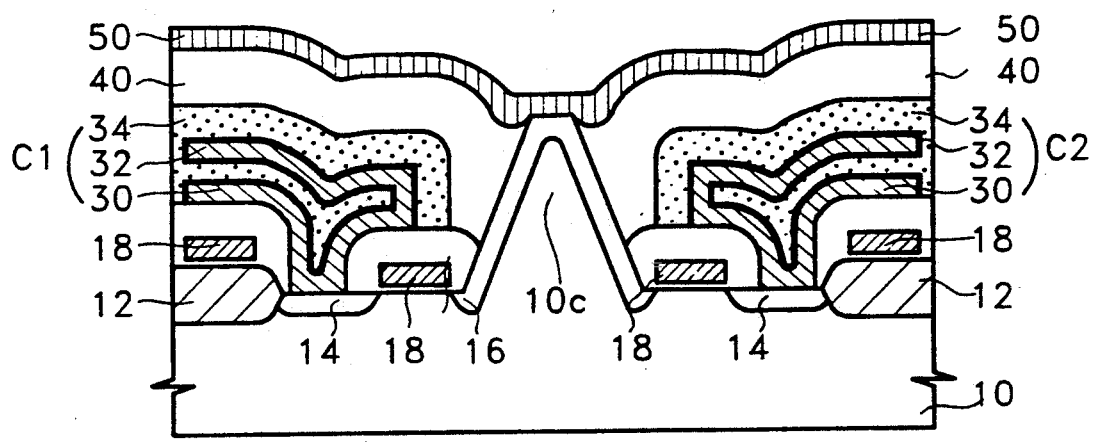
FIG. 6 is a cross section of an interconnection structure manufactured by yet another embodiment of the forming method of the interconnection structure of the semiconductor device according to the present invention.

FIG. 6 is a cross section of another embodiment of the forming method of the interconnection structure of the semiconductor device according to the present invention in which the side walls of a projection 10c are inclined. The side walls have an angle of inclination of about 30°-60°.

Accordingly, the present invention accomplishes reliable, high density and miniaturation of a semiconductor device since the problems of poor contacts and reliability deterioration of a conductive layer (a bit line) are solved by forming, instead of a contact hole, a projection having the inverse shape of the contact hole on the region where the contact hole with a large aspect ratio, that is, narrow deep, should be formed, and subsequent processes can be performed on a planar surface. In addition, it is obvious that electrical properties of a device are enhanced owing to less leakage current by the rounding of the projection's edges, and the basic principle of the present invention can be applied for all structures wherein a lower conductive layer is connected to a upper conductive layer.

While the invention has been particularly shown and described with reference to preferred embodiments thereof, it will be understood by those skilled in the art that various changes in form and details may be made therein without departing from the spirit and scope of the invention as defined by the appended claims.

What is claimed is:

1. An interconnection structure in a semiconductor device for connecting a lower conductive layer to an upper conductive layer, said interconnection structure comprising:
    a projection which is left by selectively etching a semiconductor substrate to a certain depth;
    a lower conductive layer formed inwardly from at least part of the surface of said projection;
    a surrounding structure formed around said projection; and
    an upper conductive layer formed on the upper surfaces of said surrounding structure and connected to at least part of the surface of said lower conductive layer,
    whereby the planarization of said upper conductive layer is improved and
    wherein said lower conductive layer is a drain region, said upper conductive layer is a bit line, said surrounding structure includes a transistor and a capacitor, and said projection has inclined side walls.

2. An interconnection structure in a semiconductor device as claimed in claim 1, wherein at least part of said lower conductive layer includes at least part of the upper structure of said projection.

3. An interconnection structure in a semiconductor device as claimed in claim 1, wherein the height of said projection is about the height of said surrounding structure.

4. An interconnection structure in a semiconductor device as claimed in claim 1, wherein the inclination of said inclined side walls is about 30°-60°.

5. An interconnection structure in a semiconductor device as claimed in claim 1, wherein part of said surrounding structure is formed on the side walls of said projection.

6. An interconnection structure in a semiconductor device for connecting a lower conductive layer to an upper conductive layer, said interconnection structure comprising:
    a projection which is left by selectively etching a semiconductor substrate to a certain depth;
    a lower conductive layer formed inwardly from at least part of the surface of said projection;
    a surrounding structure formed around said projection; and an upper conductive layer formed on the upper surfaces of said surrounding structure and connected to at least part of the surface of said lower conductive layer, whereby the planarization of said upper conductive layer is improved and wherein said lower conductive layer is a drain region, said upper conductive layer ia a bit line, said surrounding structure includes a transistor and a capacitor, and said projection has concave side walls.

7. An interconnection structure in a semiconductor device as claimed in claim 6, wherein part of said surrounding structure is formed on the side walls of said projection.

8. An interconnection structure in a semiconductor device as claimed in claim 6, wherein the edges of said projection are rounded.

9. An interconnection structure in a semiconductor device for connecting a lower conductive layer to an upper conductive layer, said interconnection structure comprising:

a projection which is left by selectively etching a semiconductor substrate to a certain depth;

a lower conductive layer formed outwardly from at least part of the surface of said projection;

a surrounding structure formed around said projection; and an upper conductive layer formed on the upper surfaces of said surrounding structure and connected to at least part of the surface of said lower conductive layer, whereby the planarization of said upper conductive layer is improved and wherein said lower conductive layer is a drain region, said upper conductive layer is a bit line, said surrounding structure includes a transistor and a capacitor, and said projection has inclined side walls.

10. An interconnection structure in a semiconductor device as claimed in claim 9, wherein at least part of said lower conductive layer includes at least part of the upper surface of said projection.

11. In a semiconductor device which includes:

switching transistors each having a source and a drain region formed about an upper surface of a substrate and isolated from each other by a channel region, and a gate electrode formed by interleaving a gate oxide layer on the channel region of said structure;

capacitors each having a storage electrode in contact with the source region of a corresponding switching transistor and formed on a certain area, a dielectric layer covering said storage electrode, and a plate electrode formed on said dielectric layer; and a bit line in contact with the drain region of each corresponding switching transistor, an interconnection structure which comprises:

a projection resulting from an etching of a surrounding area of a portion of said substrate to a predetermined depth, a non-etched portion constituting said projection and an etched portion constituting a surrounding structure, wherein said surrounding structure includes one of said switching transistors and one of said capacitors associated therewith, a drain region of said one switching transistor extending inwardly from the surface of said projection and making contact with a bit line formed on an upper surface of said surrounding structure and an upper surface of said projection, said projection having inclined side walls.

12. An interconnection structure in a semiconductor device as claimed in claim 6, wherein the height of said projection is about the height of said surrounding structure.

13. An interconnection structure in a semiconductor device as claimed in claim 1, wherein the edges of said projection are rounded.

14. An interconnection structure in a semiconductor device as claimed in claim 6, wherein part of said surrounding structure is formed on the side walls of said projection.

15. An interconnection structure in a semiconductor device as claimed in claim 11, wherein the inclination of said inclined side walls is about 30°-60°.

16. An interconnection structure in a semiconductor device as claimed in claim 11, wherein the height of said projection is about the height of said surrounding structure.

17. An interconnection structure in a semiconductor device as claimed in claim 11, wherein the edges of said projection are rounded.

18. An interconnection structure in a semiconductor device as claimed in claim 11, wherein part of said surrounding structure is formed on the side walls of said projection.

* * * * *